(12) United States Patent
Zhang et al.

(10) Patent No.: US 12,501,614 B2
(45) Date of Patent: Dec. 16, 2025

(54) THREE-DIMENSIONAL MEMORY DEVICES WITH STACK STRUCTURES, AND FABRICATING METHODS THEREOF

(71) Applicant: Yangtze Memory Technologies Co., Ltd., Hubei (CN)

(72) Inventors: Zhong Zhang, Hubei (CN); Kun Zhang, Hubei (CN); Wenxi Zhou, Hubei (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 875 days.

(21) Appl. No.: 17/697,684

(22) Filed: Mar. 17, 2022

(65) Prior Publication Data

US 2022/0310650 A1 Sep. 29, 2022

(30) Foreign Application Priority Data

Mar. 26, 2021 (CN) .......................... 202110326987.6

(51) Int. Cl.
*H10B 43/27* (2023.01)
*H10B 41/27* (2023.01)

(52) U.S. Cl.
CPC ............. *H10B 43/27* (2023.02); *H10B 41/27* (2023.02)

(58) Field of Classification Search
CPC ........ H10B 43/27; H10B 43/50; H10B 41/27; H10B 41/20; H10B 41/30; H10B 41/50
See application file for complete search history.

(56) References Cited

U.S. PATENT DOCUMENTS

| 11,950,418 | B2 | 4/2024 | Liu et al. | |
|---|---|---|---|---|
| 2017/0373078 | A1 | 12/2017 | Chu et al. | |
| 2019/0081070 | A1* | 3/2019 | Lu | H10B 41/41 |
| 2020/0168440 | A1* | 5/2020 | Kang | H01L 21/0206 |
| 2021/0375888 | A1* | 12/2021 | Lu | H10D 30/6755 |
| 2022/0208785 | A1* | 6/2022 | Titus | H10B 41/10 |

FOREIGN PATENT DOCUMENTS

| CN | 108922891 A | 11/2018 | |
|---|---|---|---|
| CN | 208589444 U | 3/2019 | |
| CN | 108922891 B | * 12/2019 | ............ H01L 27/115 |
| CN | 111033729 A | 4/2020 | |

* cited by examiner

*Primary Examiner* — Wael M Fahmy
*Assistant Examiner* — Tiberiu Dan Onuta
(74) *Attorney, Agent, or Firm* — Hanley, Flight & Zimmerman, LLC

(57) ABSTRACT

Three-dimensional memory devices and fabricating methods therefore are disclosed. The memory device can comprise a stack structure comprising a plurality of gate layers, a plurality of first insulating layers, and a plurality of second insulating layers. The stack structure has a staircase region comprising a plurality of stair structures. Each stair structure comprises a first portion of the stair structure comprising one gate layer and a first portion of one first insulating layer, and a second portion of the stair structure comprising a second portion of the one first insulating layer and a second insulating layer. The memory device can further comprise at least one contact structure each located on a top surface of one of the plurality of stair structures, and at least one contact portion in contact with the at least one contact structure.

12 Claims, 18 Drawing Sheets

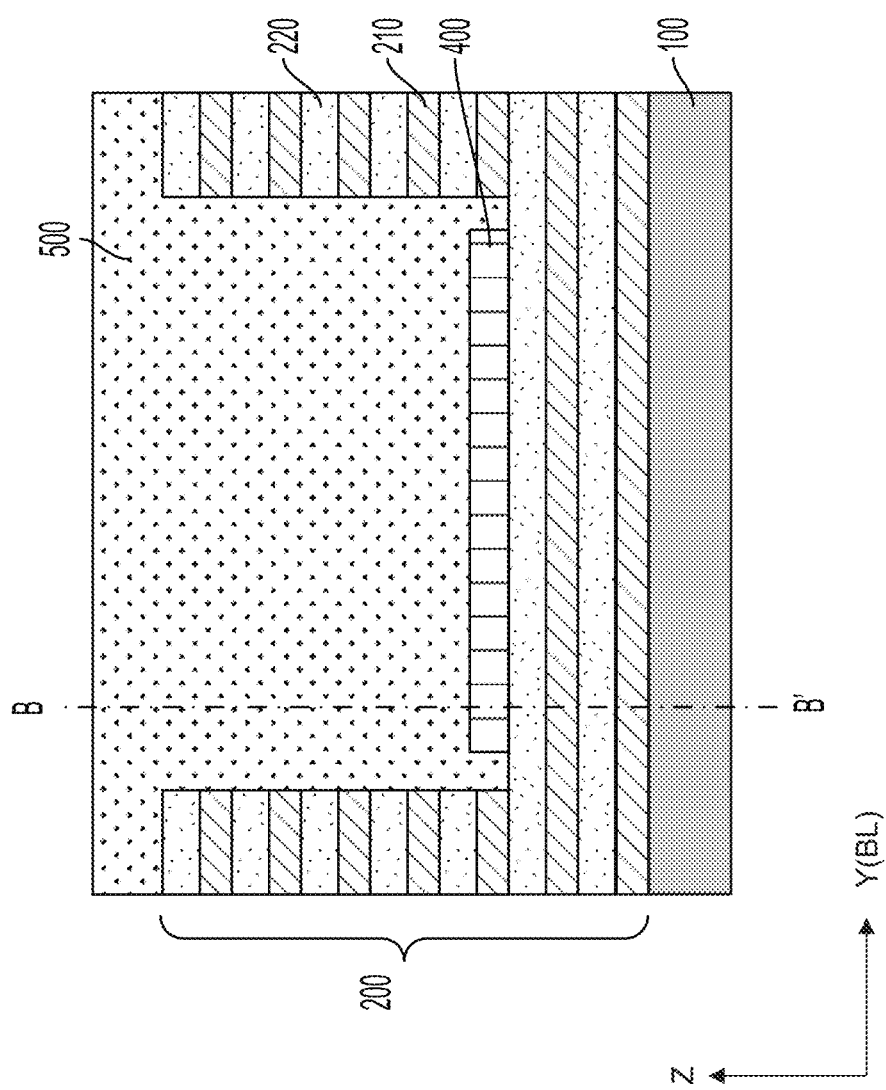

THREE-DIMENSIONAL MEMORY DEVICES WITH STACK STRUCTURES, AND FABRICATING METHODS THEREOF

CROSS-REFERENCE TO RELATED APPLICATIONS

This application claims priority to Chinese Patent Application No. 202110326987.6, filed on Mar. 26, 2021, which is incorporated herein by references in its entirety.

TECHNICAL FIELD

The present disclosure generally relates to the field of semiconductor technology, and more particularly, to a three-dimensional (3D) memory device and a fabricating method thereof.

BACKGROUND

With the development of the semiconductor manufacturing process, the storage density of computer memory is continuously increasing and the size of computer memory is continuously decreasing. Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit. A three-dimensional (3D) memory architecture can address the density limitation in planar memory cells. The 3D memory architecture includes a memory array and peripheral devices for controlling signals to and from the memory array.

Generally, the memory array of a 3D memory device includes a stacked structure comprising a plurality of alternately stacked gate layers and a plurality of insulating layers. The electrical connection between an external circuit and the gate layers is realized through a plurality of gate contacts located in a staircase region of the stacked structure. In the fabricating process of the three-dimensional memory device, in order to realize the electrical connection between later formed gate contacts and the gate layers in the stacked structure, an etching process is performed to remove portions of the dielectric layer covering the stacked structure to form a plurality of gate contact holes to expose the top surface of each second insulating layer corresponding to each later formed gate layer in the staircase region. The gate contact holes are then filled with conductive material to form the plurality of gate contacts.

However, with the increasing in the degree of integration of the 3D memory device and the increase in the number of stacked layers, over etch of some gate contact holes may occur due to the uneven etching of the gate contact holes in the staircase region. Thus, the second insulating layers may be broken down during the formation of the gate contact holes. In such case, after filling the conductive material into the gate contact holes and the gate replacement operation to replace the second insulating layer by gate layers, a short circuit may be formed between different gate layers. That is, cross word line short circuits may be caused between different layers, thereby resulting a failure of the 3D memory device.

Therefore, there is a need for a 3D memory device and a manufacturing method thereof, which can avoid the word line bridge problem, thereby improving the electrical performance and product yield of the 3D memory devices.

BRIEF SUMMARY

Aspects of 3D memory devices and fabrication methods thereof are disclosed herein.

One aspect of the present disclosure provides a method of forming a three-dimensional memory device, comprising: forming a dielectric stack structure comprising a plurality of first insulating layers and a plurality of second insulating layers on a semiconductor layer, wherein the dielectric stack structure comprises a staircase region; forming a buffer layer to cover the staircase region; removing portions of the plurality of second insulating layers to form a plurality of horizontal trenches; removing a portion of the buffer layer above at least one horizontal tranche to form at least one upper space on the horizontal trench; forming a plurality of gate layers in the plurality of horizontal trenches; and forming at least one contact structure in the at least one upper space.

In some aspects, forming the stack structure comprises: alternately forming the plurality of first insulating layers and the plurality of second insulating layers on the semiconductor layer; removing portions of the plurality of second insulating layers and the first insulating layers to form the plurality of first type stairs, wherein each first type stair exposes a portion of the corresponding first insulating layer; and removing the exposed portion of the corresponding first insulating layer in each first type stair to form a plurality of second type stairs.

In some aspects, the method further comprises: before forming the plurality of horizontal trenches, forming a dielectric layer on the plurality of second type stairs and the buffer layer; and after forming the at least one contact structure, forming at least one contact portion in the dielectric layer and in contact with the at least one contact structure.

In some aspects, the method further comprises: before forming the dielectric layer, removing portions of the buffer layer on the sidewall of each second type stair; wherein the dielectric layer is formed to cover the sidewall of each second type stair.

In some aspects, each of the at least one upper space comprises: a first portion of the at least one upper space above and interconnected with a corresponding horizontal trench; and a second portion of the at least one upper space above and exposing an un-removed portion of a corresponding second insulating layer.

In some aspects, each of the at least one contact structure comprises: a first portion of the at least one contact structure above and in contact with one corresponding gate layer; and a second portion of the at least one contact structure above the un-removed portion of one corresponding second insulating layer and in contact with an un-removed portion of the buffer layer.

In some aspects, the at least one contact portion is in contact with the second portion of the at least one contact structure.

In some aspects, in a first etchant, a first etching rate of the buffer layer is greater than a second etching rate of the second insulating layer.

In some aspects, in the first etchant, the first etching rate of the buffer layer is at least 10 times of the second etching rate of the second insulating layer.

In some aspects, the buffer layer comprises polycrystalline silicon; and the second insulating layer comprises a nitride material.

In some aspects, removing the portions of the plurality of second insulating layers comprises: using phosphoric acid as a second etchant, and performing a wet etching process to remove the portions of the plurality of second insulating layers.

In some aspects, removing the portion of the buffer layer comprises: using tetramethylammonium hydroxide as the first etchant, and performing a wet etching process to remove the portion of the buffer layer.

In some aspects, the plurality of gate layers and the at least one contact structure are formed in a same process of filling the plurality of horizontal trenches and the at least one upper space with a conductive material.

Another aspect of the present disclosure provides a three-dimensional memory device, comprising: a semiconductor layer; a stack structure comprising a plurality of gate layers, a plurality of first insulating layers, and a plurality of second insulating layers, wherein the stack structure has a staircase region comprising a plurality of stair structures, wherein each stair structure comprises: a first portion of the stair structure comprising one of the plurality of gate layers and a first portion of one of the plurality of first insulating layers, and a second portion of the stair structure comprising a second portion of the one of the plurality of first insulating layers and one of the plurality of second insulating layers; at least one contact structure each located on a top surface of one of the plurality of stair structures; and at least one contact portion in contact with the at least one contact structure.

In some aspects, the device further comprises: a dielectric layer located above the plurality of stair structures and the at least one contact structure; wherein the at least one contact portion is located in the dielectric layer.

In some aspects, a top surface of the at least one contact structure is coplanar with or lower than a bottom surface of a gate layer in an upper stair structure of the one of the plurality of stair structures.

In some aspects, the at least one contact structure comprises: a first portion of the at least one contact structure located on the first portion of the corresponding stair structure, and in contact with a top surface of the gate layer of the corresponding stair structure; and a second portion of the at least one contact structure located on the second portion of the corresponding stair structure, and in contact with a top surface of the second insulating layer of the corresponding stair structure.

In some aspects, the at least one contact portion is in contact with the second portion of the at least one contact structure.

In some aspects, the second portion of the at least one contact structure is further in contact with a buffer layer located in a same level of the at least one contact structure.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

FIGS. 2-6, 7A-7B, 8A-8E, 9A-9C and 10A-10B illustrate schematic cross-sectional views of an exemplary 3D memory device at certain fabricating stages of the disclosed method according to some aspects of the present disclosure.

Figure 1:
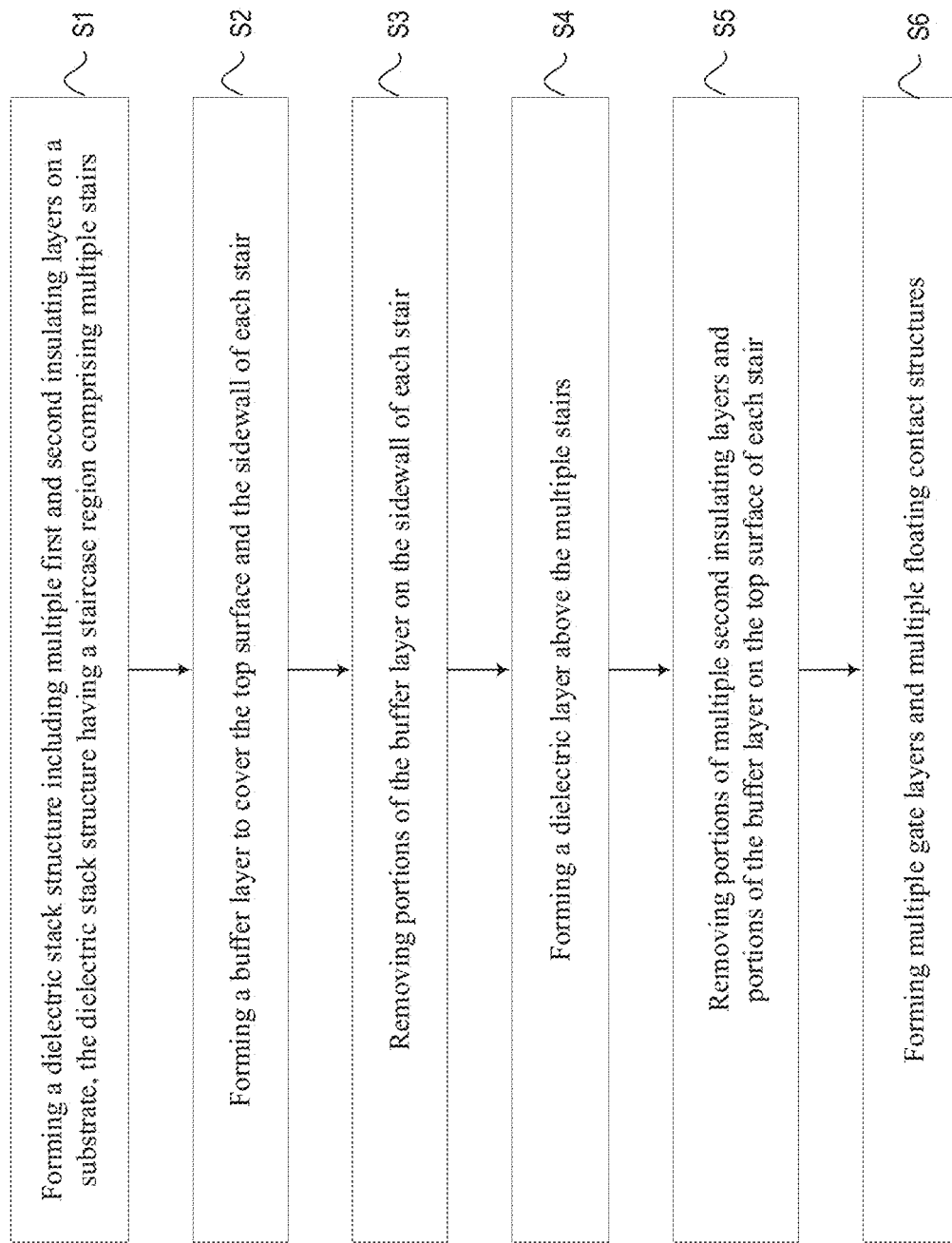
FIG. 1 illustrates a flow diagram of an exemplary method for forming a 3D memory device, according to some aspects of the present disclosure.

Aspects of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one aspect," "an aspect," "an example aspect," "some aspects," etc., indicate that the aspect described may include a particular feature, structure, or characteristic, but every aspect may not necessarily include the particular feature, structure, or characteristic. Moreover, such phrases do not necessarily refer to the same aspect. Further, when a particular feature, structure or characteristic is described in connection with an aspect, it would be within the knowledge of a person skilled in the pertinent art to effect such feature, structure or characteristic in connection with other aspects whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnection layer can include one or more conductor and contact layers (in which contacts, interconnect lines, and/or vias are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically-oriented strings of memory cell transistors (i.e., region herein as "memory strings," such as NAND strings) on a laterally-oriented substrate so that the memory strings extend in the vertical direction with respect to the substrate. As used herein, the term "vertical/vertically" means nominally perpendicular to a lateral surface of a substrate.

FIG. 1 illustrates a flow diagram of an exemplary method 1000 for forming a 3D memory device, according to some aspects of the present disclosure.

As shown in FIG. 1, method 1000 can include the following steps:

In step S1, a stack structure is formed on a semiconductor layer. The semiconductor layer can be a substrate, or one or more layers comprising any suitable semiconductor materials. The stack structure can include a staircase region comprising a plurality of stairs. Each stair can include a first insulating layer and a second insulating layer. In some aspects, a portion of the second insulating layer can be used as a gate sacrificial layer that is to be replaced by a gate layer in subsequent processes. In each stair, at least a portion of the top surface of the second insulating layer is exposed. Step S1 is described in detail below in connection with FIGS. 2-4.

In step S2, a buffer layer is formed to cover the top surface and the sidewall of each stair. Step S2 is described in detail below in connection with FIG. 5.

In step S3, the buffer layer on the sidewall of each stair is removed. Step S3 is described in detail below in connection with FIG. 6.

In step S4, a dielectric layer is formed above the multiple stairs to provide a flat top surface for the staircase region of the stack structure. Step S4 is described in detail below in connection with FIGS. 7A-7B.

In step S5, the multiple second insulating layers can be removed, and the buffer layer on the top surface of each stair can be removed. Step S5 is described in detail below in connection with FIGS. 8A-8E.

In step S6, the horizontal trenches formed by removing the second insulating layers can be filled with conductive material to form multiple gate layers, and the space formed by removing the buffer layer on the top surface of each stair can be filled with conductive material to form a contact structure (also referred as "floating contact structure"). Step S6 is described in detail below in connection with FIGS. 9A-9C.

In some existing fabricating method, the formation of the gate contacts can be achieved by using an ion implantation (IMP) process. Specifically, after forming the multiple stairs, the second insulating layer on the top surface of each stair can be treated to make a material modification. The etching ratio of the modified material of the second insulating layer and the conventional material of the second insulating layer can be used to form the gate contacts. However, the IMP process is difficult to control the consistency of the material modification. It can cause damage to the first insulating layer under the second insulating layer, and even cause damage to the next second insulating layer under the first insulating layer. Such damages can lead to short connections between gate layers thus resulting memory failures.

As described above, in present disclosure, a buffer layer can be formed on the top surface of the second insulating layer of each stair. The second insulating layer can be removed and filled with the conductive material to form the gate layer. The buffer layer on the top surface of each stair can then be removed. A conductive material can be filled into the formed space to form a contact structure to realize the electrical connection between the gate layer and the gate contact. Comparing with the IMP process used in the existing method, the method provided by the present disclosure effectively improves the process controllability of forming the stair structure and effectively avoids damage to the underlying layers.

FIGS. 2-6, 7A-7B, 8A-8E, 9A-9C and 10A-10B illustrate schematic cross-sectional views of an exemplary 3D memory device at certain fabricating stages of the disclosed method according to some aspects of the present disclosure.

Figure 2:
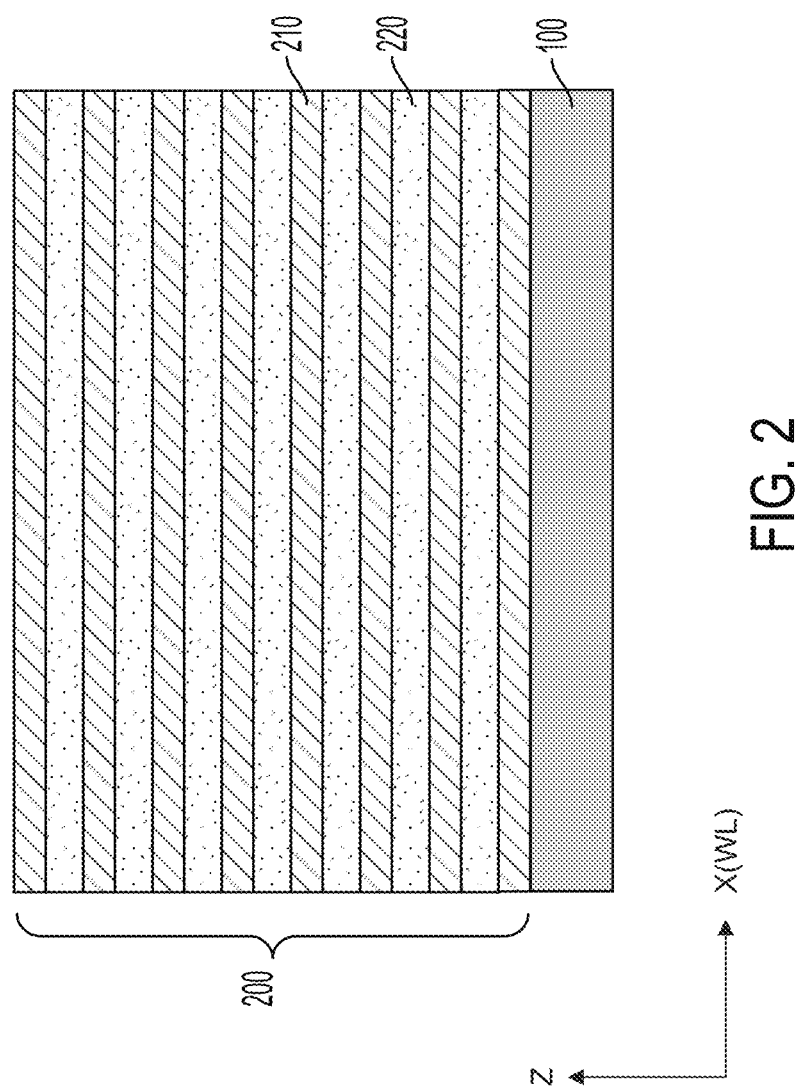
Figure 3:
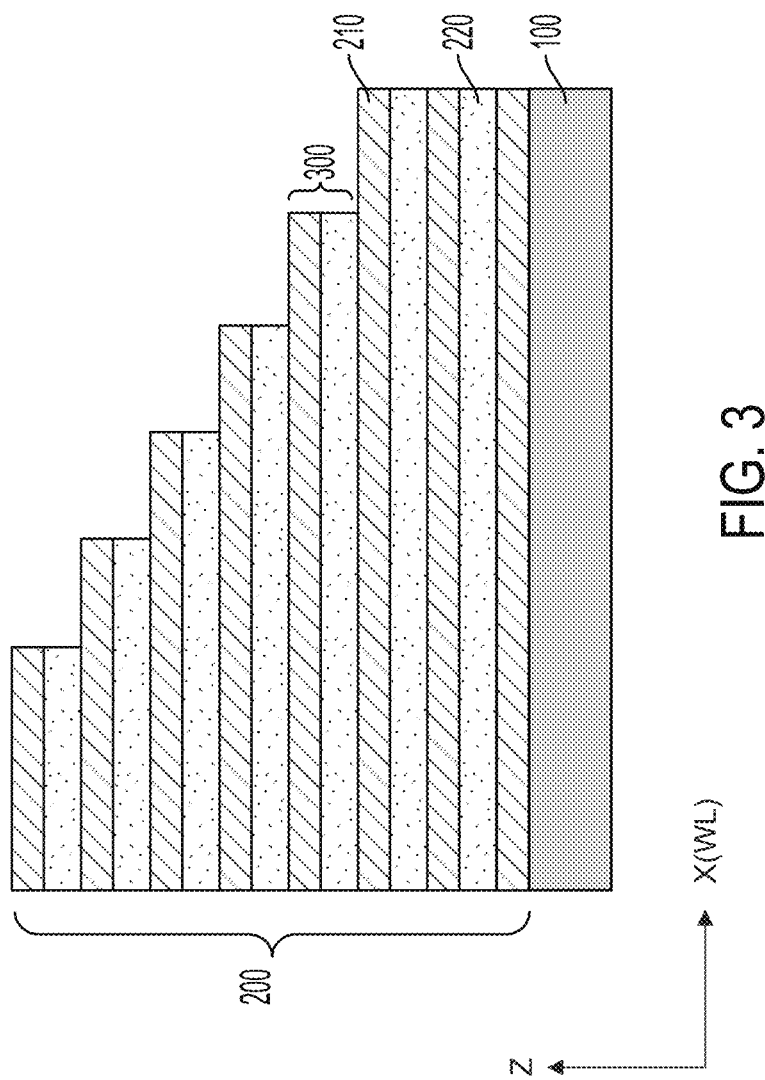
Figure 4:
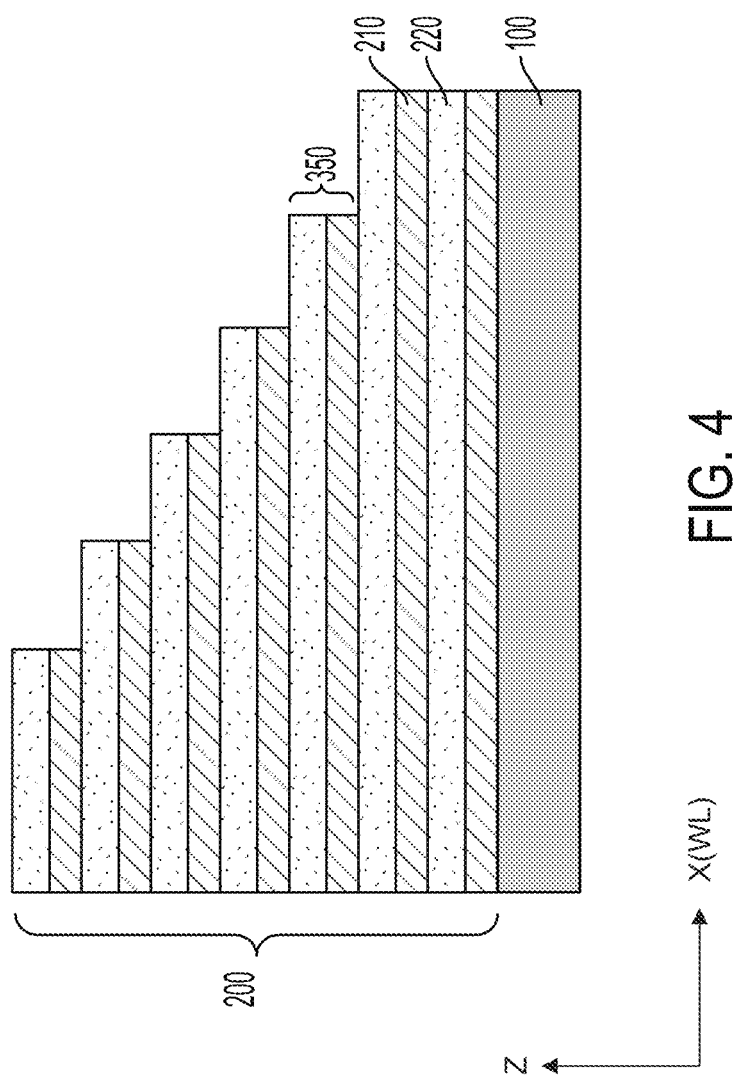

As shown in FIGS. 2-4, step S1 of forming a dielectric stack structure including a staircase region on a semiconductor layer can include the following operations:

In operation S1-1, a semiconductor layer can be provided, and a dielectric stack structure can be formed on the semiconductor layer. The dielectric stack structure can include multiple alternately stacked second insulating layers and first insulating layers (referring to FIG. 2).

In operation S1-2, portions of the second insulating layers and the first insulating layers in a staircase region of the dielectric stack structure can be removed to form a stair structure including multiple stairs. A top surface of each stair exposes at least a part of the corresponding first insulating layer (referring to FIG. 3).

In operation S1-3, a portion of the first insulating layer on the top surface of each stair can be removed to expose at least a part of the sacrificial gate layer below the first insulating layer (referring to FIG. 4).

FIG. 2 illustrates a schematic cross-sectional view of an exemplary 3D memory device after operation S1-1, according to some aspects of the present disclosure.

As shown in FIG. 2, a dielectric stack structure 200 can be formed on a semiconductor layer 100. The dielectric stack structure 200 can include a plurality of alternatively stacked first insulating layers 210 and second insulating layers 220. The dielectric stack structure 200 can include a core region configured to arrange memory cells, and a staircase region configured to arrange word line connection structures.

In some aspects of the present disclosure, the semiconductor layer 100 can be a substrate, such as a monocrystalline silicon (Si) substrate, a monocrystalline germanium (Ge) substrate, a silicon germanium (GeSi) substrate, a silicon carbide (SiC) substrate, a silicon-on-insulator (SOI) substrate, a germanium-on-insulator (GOI) substrate, or any other suitable substrate including other semiconductor materials, such as gallium arsenide (GaAs), indium phosphide (InP), SiC, etc. The semiconductor layer 100 can have a laminated structure, such as a Si/SiGe stack, etc. The semiconductor layer 100 can include any suitable epitaxial structures, such as silicon germanium on insulator (SGOI), etc.

The dielectric stack structure 200 can be formed on the semiconductor layer 100 by one or more deposition processes. The deposition processes can include, but is not limited to, atomic layer deposition (ALD), physical vapor deposition (PVD), chemical vapor deposition (CVD), or any combination thereof. The number and thickness of the first insulating layers 210 and the second insulating layers 220 can be designed by actual needs, and are not limited to the number and thickness as shown in FIG. 1. The first insulating layers 210 can include any suitable dielectric material, such as oxide material (e.g., silicon oxide). The second insulating layer 220 can include any suitable dielectric material different from the dielectric material of the first insulating layers 210. For example, The first insulating layers 210 can include nitride material, such as silicon nitride.

The dielectric stack structure 200 can include a core region (not shown) and a staircase region. The core region is configured to arrange an array of memory cell strings. Each memory cell string includes a plurality of interconnected memory cells extending in a vertical direction perpendicular to the top surface of the semiconductor layer 100. The staircase region is configured to arrange word line connection structures.

It is noted that, the description about the dielectric stack structure 200 uses a single stack as an example. In some other aspects of the present disclosure, the dielectric stack structure 200 can include two or more stacks.

FIG. 3 illustrates a schematic cross-sectional view of an exemplary 3D memory device after operation S1-2, according to some aspects of the present disclosure.

As shown in FIG. 3, multiple first type stairs 300 can be formed in the staircase region of the dielectric stack structure 200. For example, a repeated etching-trimming process can be performed on the dielectric stack structure 200 by using a patterned mask (not shown) to form a plurality of multiple first type stairs 300 in the staircase region. The patterned mask can include photoresist or a carbon-based polymer material, and can be removed after forming the first type stairs 300. Referring to FIG. 3, the top surface of each first type stair 300 can expose at least a portion of the first insulating layer 210 in the corresponding level. That is, each s first type fair 300 can include at least one level, and each level can include the first insulating layer 210 at the top and the second insulating layer 220 at the bottom.

In various aspects of the present disclosure, the first type stairs 300 can be formed at a center position of the dielectric stack structure 200, and can also be formed on one side edge or multiple side edges of the dielectric stack structure 200. In one example, the staircase region at the center position can include a first connection area, a second connection area, and a third connection area that are arranged in sequence. The second connection area can include the multiple stairs first type 300. The first connection area and the third connection area located on both sides of the second connection area do not include the first type stairs 300.

In various aspects of the present disclosure, the height of each stairs respectively can be gradually increased along the direction away from the core region of the dielectric stack structure, or can be gradually decreased along the direction away from the core region of the dielectric stack structure, and can also be arranged symmetrically with respect to the center position. In various aspects of the present disclosure, each stair can expose a portion of the top surface of the corresponding first insulating layer, and can also expose a portion of the top surface of the corresponding second insulating layer. In various aspects of the present disclosure, the staircase region can be a single stair structure or a partitioned stair structure. The partitioned stair structure can have different partitions (e.g., 3 partitions, 4 partitions, etc.).

It should be noted that, the figures only show the exemplary aspect that each stair includes one level. It should also be noted that the number of stairs can be adjusted as needed, which depends on the number of second insulating layers in the dielectric stack structure and the number of levels included in each stair.

FIG. 4 illustrates a schematic cross-sectional view of an exemplary 3D memory device after operation S1-3, according to some aspects of the present disclosure.

As shown in FIG. 4, in some aspects of the present disclosure, after forming the first type stairs, one or more etching processes, such as wet etching or dry etching, can be performed to remove at least a portion of the first insulating layer 210 on the top surface of each first type stair to expose at least a portion of the second insulating layer 220.

Thus, a plurality of second type stairs 350 can be formed in the staircase region. Each second type stairs 350 includes at least one level, and each level includes a second insulating layer 220 at the top and an first insulating layer 210 at the bottom. It should be noted that, the structure of the second type stair 350 formed in operation S1-3 is different from the first type stair 300 formed in operation S1-2.

Figure 5:
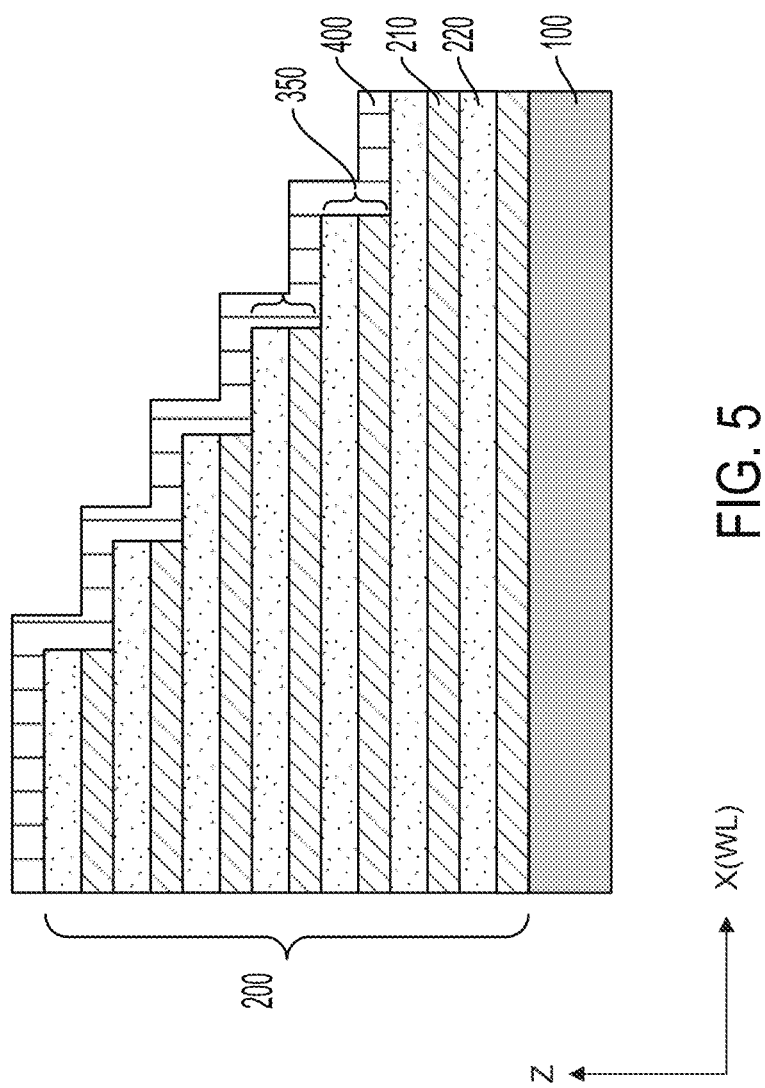

FIG. 5 illustrates a schematic cross-sectional view of an exemplary 3D memory device after step S2, according to some aspects of the present disclosure.

As shown in FIG. 5, in some aspects of the present disclosure, a buffer layer 400 is formed on the top surface and the sidewall of each second type stair 350. The buffer layer 400 can cover the exposed portion of the second insulating layer 220 on the top surface of each stair. The buffer layer 400 can also cover the sidewall of each stair. That is, the buffer layer 400 can attach to the common sidewall of the second insulating layer 220 and the first insulating layer 210 on the sidewall of each stair. In some aspects, the buffer layer 400 can be configured to occupy certain spaces on each second type stair 350 that is used for forming a float contact structure on each second type stair 350 in subsequent processes.

In some aspects of the present disclosure, the buffer layer 400 can be formed on the top surface and sidewall of each second type stair 350 by one or more deposition processes, including but not limited to, atomic layer deposition (ALD), physical vapor deposition (PVD), chemical vapor deposition (CVD), and any combination thereof. In one example, the buffer layer 400 can be formed by an ALD process.

In some aspects of the present disclosure, the material of the buffer layer 400 can be different from the material of the sacrificial layer 220. The material of the buffer layer 400 and the material of the sacrificial layer 220 can be etched by using different types of wet etching agents, respectively. For example, the material of the buffer layer 400 can be polysilicon. For various wet etching agents, the polysilicon and the silicon oxide-based material and/or silicon nitride-based material in the dielectric stack structure can have different etching rates. Specifically, when using a first etchant, an etching rate of the buffer layer 400 can be much greater than (e.g., greater than 10 times of) an etching rate of the sacrificial layers 220. When using a second etchant, and an etching rate of the buffer layer 400 in a second etchant can be much smaller than (e.g., less than one fifth of) an etching rate of the sacrificial layers 220. The etching ratio between the buffer layer 400 and dielectric materials of the dielectric stack structure can be beneficial to the subsequent formation of the contact structures.

Figure 6:
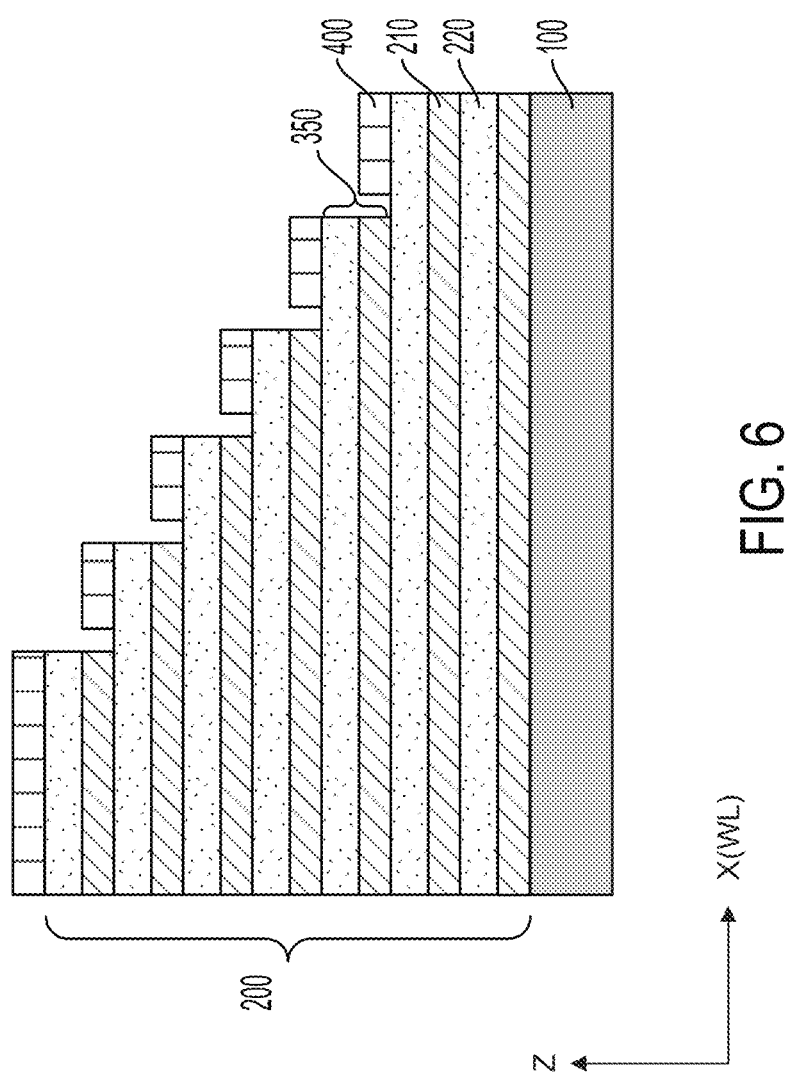

FIG. 6 illustrates a schematic cross-sectional view of an exemplary 3D memory device after step S3, according to some aspects of the present disclosure.

As shown in FIG. 6, in some aspects of the present disclosure, portions of the buffer layer 400 that are formed on the sidewall of each stair can be removed, such that the buffer layer 400 on the top surfaces of the adjacent stairs are spaced apart from each other. Therefore, when the remaining portions of the buffer layer 400 are subsequently replaced with contact structures, the spacing can effectively prevent the word line bridging effect between adjacent upper and lower gate layers, thus avoiding a short circuit.

In some aspects of the present disclosure, the method of removing the buffer layer formed on the sidewall of the stepped step can include, but is not limited to, one or more etching processes. In one example, a dry etching process, such as deep ion reactive etching (RIDE), can be used to remove the buffer layer. In another example, a wet etching process can be used to remove the buffer layer. When the buffer layer is formed of polysilicon, tetramethylammonium hydroxide (TMAH) can be used as an etching solution the wet etching process. Since polysilicon has a high dissolving rate in TMAH, the buffer layer can be removed quickly, and the damage to the silicon oxide-based material and/or silicon nitride-based material in the dielectric stack structure can be limited.

Figure 7A:
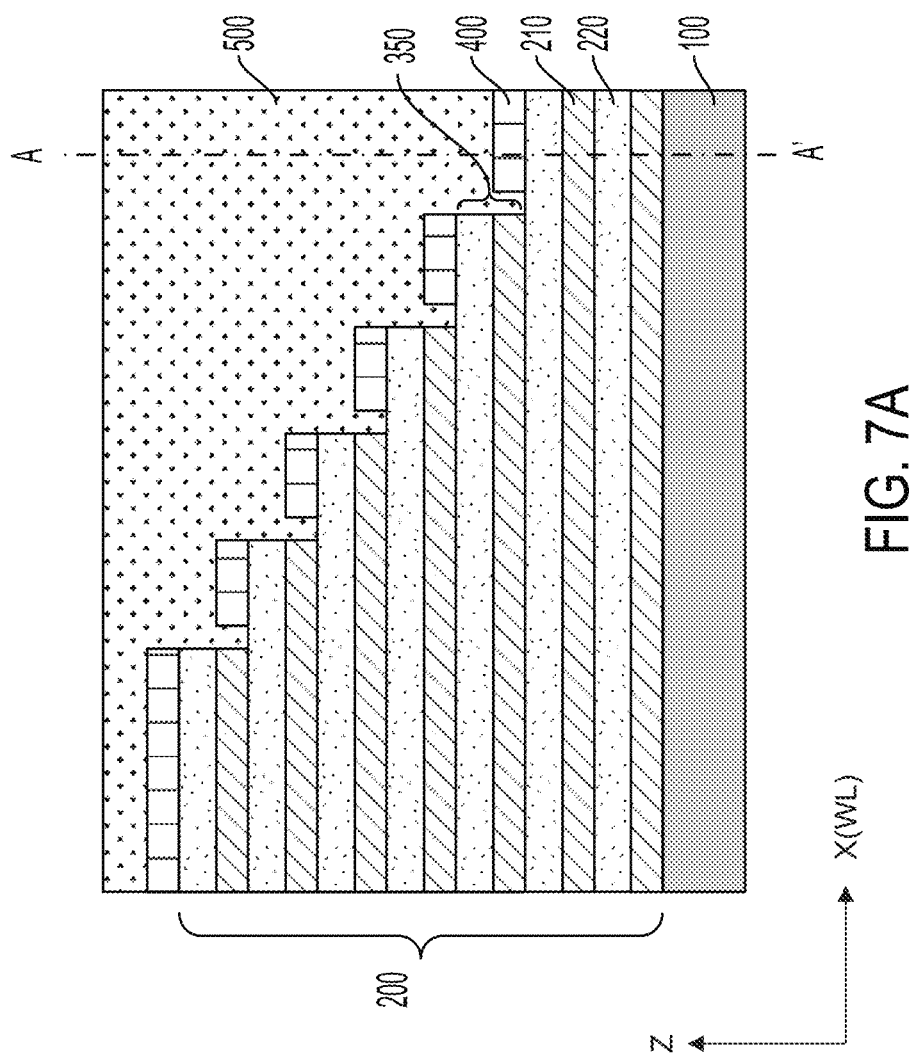

FIGS. 7A and 7B illustrate schematic cross-sectional views of an exemplary 3D memory device after step S4, according to some aspects of the present disclosure. FIG. 7A illustrates a schematic cross-sectional view along BB' direction of the exemplary 3D memory device of FIG. 7B, and FIG. 7B illustrates a schematic cross-sectional view along AA' direction of the exemplary 3D memory device of FIG. 7A.

As shown in FIGS. 7A and 7B, a dielectric layer 500 is formed above the stairs. It should be noted that, the dielectric layer 500 covers the top surfaces of the stairs, and also fills the spaces formed by removing potions of the buffer layer 400 on sidewalls of the stairs.

In some aspects of the present disclosure, the dielectric layer 500 can be formed by depositing an oxide material, such as silicon oxide-based materials. In one example of the present disclosure, the dielectric layer 500 can include tetraethylorthosilicate (TEOS)-based silicon oxide. The dielectric layer 500 can have a multi-layer structure, including a first sub-layer of silicon oxide ($SiO_2$) film formed by high-density plasma (HDP) or atomic layer deposition (ALD), and a second sub-layer of TEOS-based $SiO_2$ film. The density of the first sub-layer can be higher than the density of the second sub-layer. Thus, the first sub-layer can have a good coverage of the stairs, and the second sub-layer can have a high filling efficiency.

In some aspects of the present disclosure, a chemical mechanical polishing (CMP) process may be performed to planarize the dielectric layer 500, such that the dielectric layer 500 provides a substantially flat top surface of the staircase region of the dielectric stack structure 200.

Figure 8A:
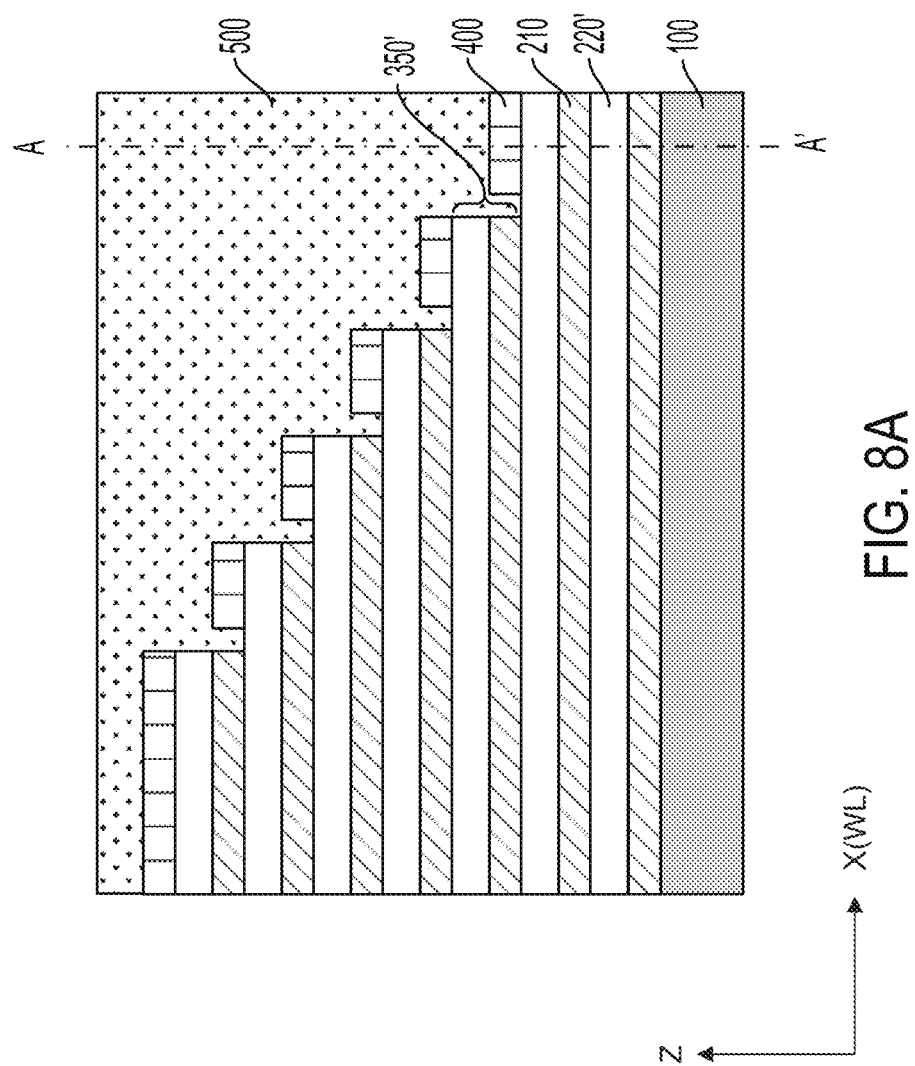
Figure 8B:
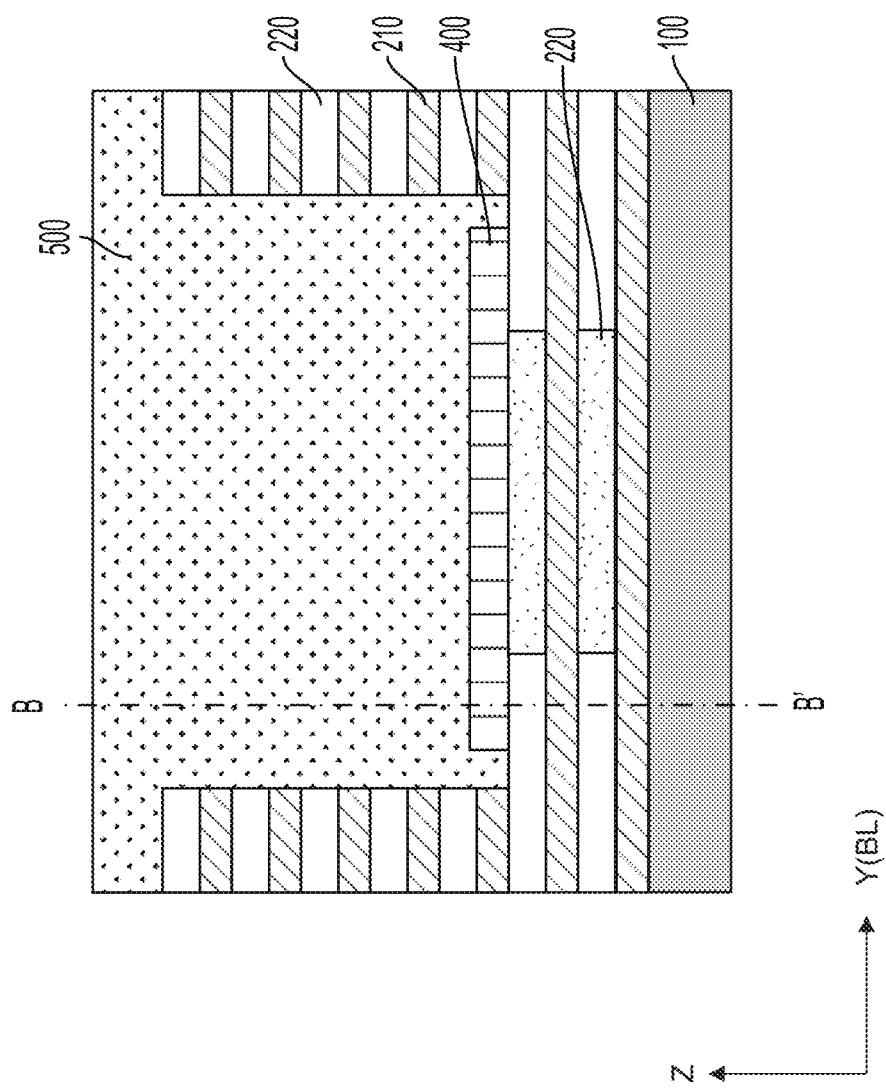
Figure 8C:
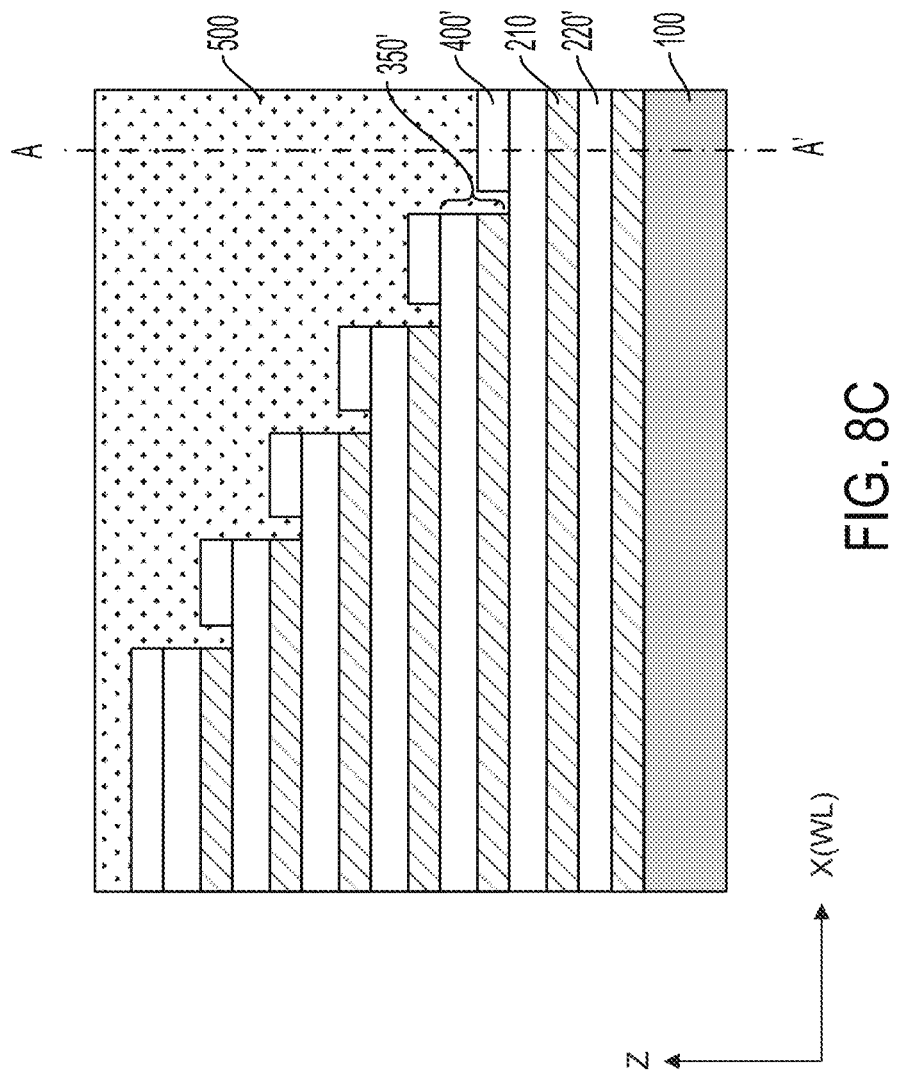
Figure 8D:
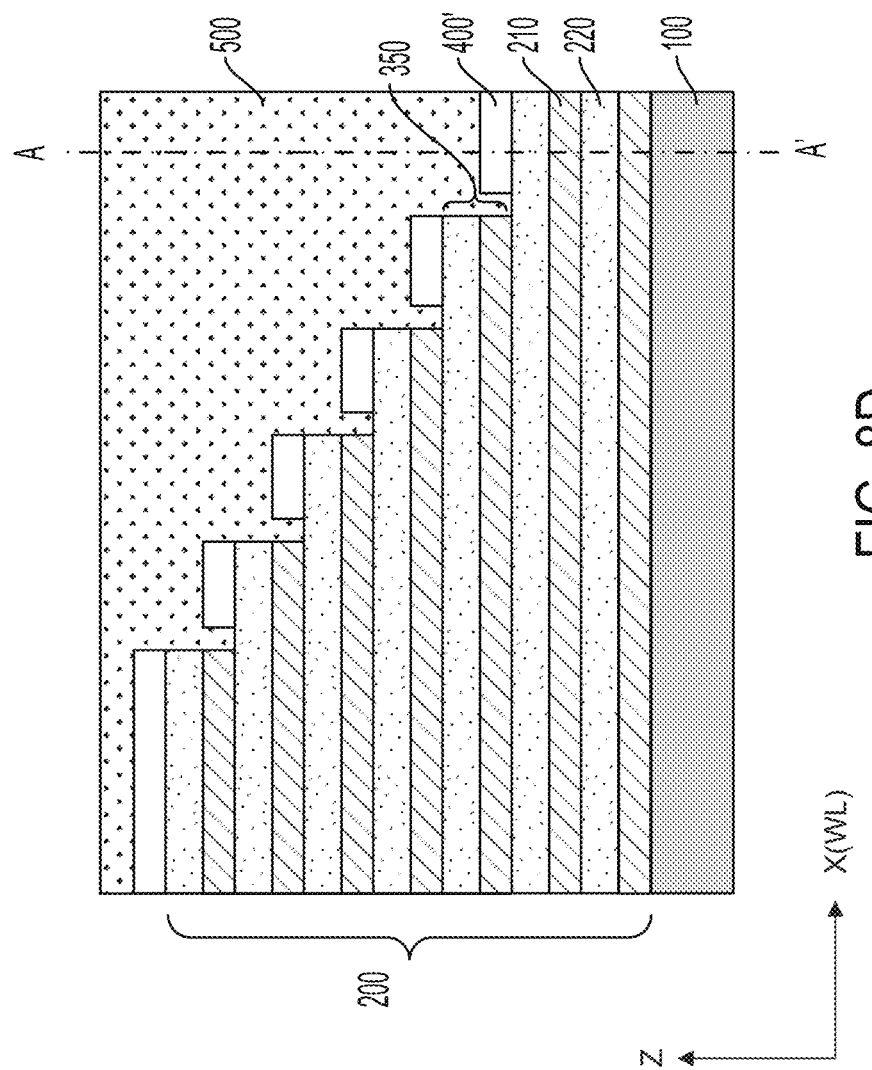
Figure 8E:
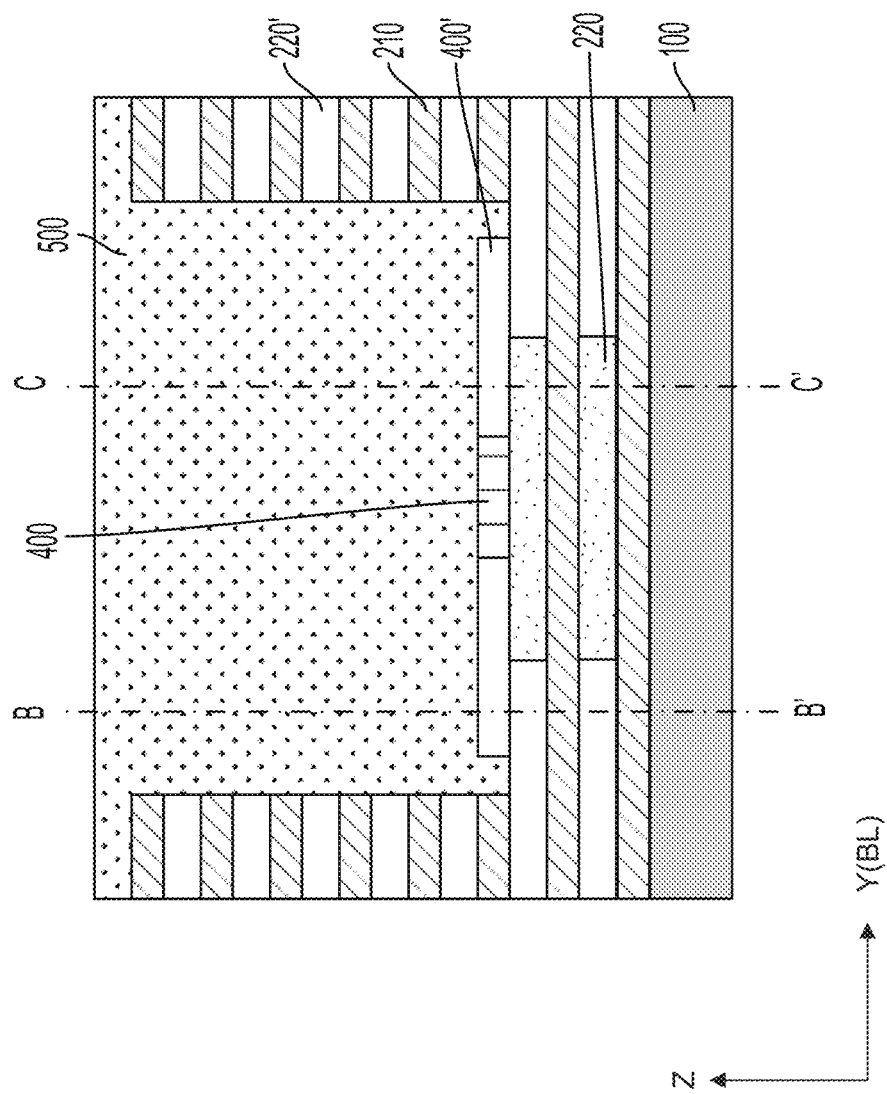

FIGS. 8A-8E illustrate schematic cross-sectional views of an exemplary 3D memory device during step S5, according to some aspects of the present disclosure. FIG. 8A illustrates a schematic cross-sectional view along BB' direction of the exemplary 3D memory device of FIG. 8B, and FIG. 8B illustrates a schematic cross-sectional view along AA' direction of the exemplary 3D memory device of FIG. 8A. FIG. 8C illustrates a schematic cross-sectional view along BB' direction of the exemplary 3D memory device of FIG. 8E, FIG. 8D illustrates a schematic cross-sectional view along CC' direction of the exemplary 3D memory device of FIG. 8E, and FIG. 8E illustrates a schematic cross-sectional view along AA' direction of the exemplary 3D memory device of FIGS. 8C and 8D.

In some aspects of the present disclosure, some portions of the second insulating layers 220 can be removed first to form a plurality of horizontal trenches 220', as shown in FIGS. 8A and 8B, and the portions of the buffer layer 400 on the top surface of each stair can be then removed to form plurality of upper spaces 400', as shown in FIGS. 8C and 8E. For example, different etchants can be selected to remove the second insulating layer 220 and the buffer layer 400 on the top surface of each stair by two wet etching processes.

In one example, the buffer layers 400 on the top surface of the stairs can include polysilicon, and the second insulating layers 220 can include SiN. A phosphoric acid, such as $H_3PO_4$, can be used to remove the SiN layer to expose the polysilicon layer. Next, a phosphorus activator, such as TMAH, can be used to remove the polysilicon layer. Since polysilicon has a fast dissolution rate in TMAH, the polysilicon buffer layer can be removed quickly, and the damage to the silicon oxide-based material and/or silicon nitride-based material in the dielectric stack structure can be limited, thereby ensuring the process windows for subsequent formed contacts.

It is noted that, FIGS. 8A, 8C and 8D illustrate cross-sectional views along the word line direction, and FIGS. 8B and 8E illustrates a cross-sectional view along the bit line direction perpendicular to the word line direction. As illustrated in FIGS. 8B and 8E, in some aspects, some portions of the second insulating layers 220 in a center potion of the stairs region may not be removed from the etching processes. The remaining portions of the second insulating layers 220 are shown in FIG. 8C in a cross-sectional view along the CC' direction. Further, as illustrated in FIG. 8E, in some aspects, some portions of the buffer layer 400 on the remaining portion of the second insulating layers 220 in the center potion of the stairs region may not be removed from the etching processes. A portion of each upper space 400' can be directly above and interconnected with a corresponding horizontal trench 220', and another portion of the each upper space 400' can be directly above and expose at least a part of the remaining portion of the second insulating layers 220.

Figure 9A:
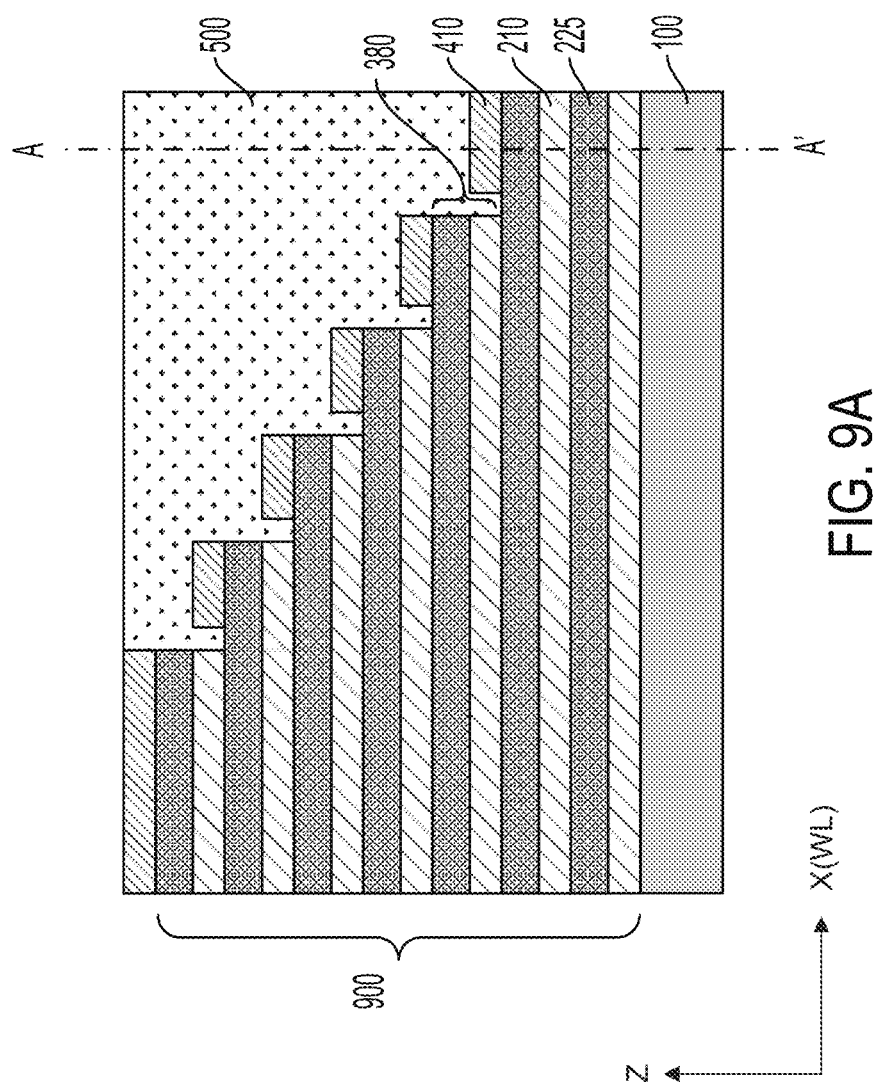
Figure 9B:
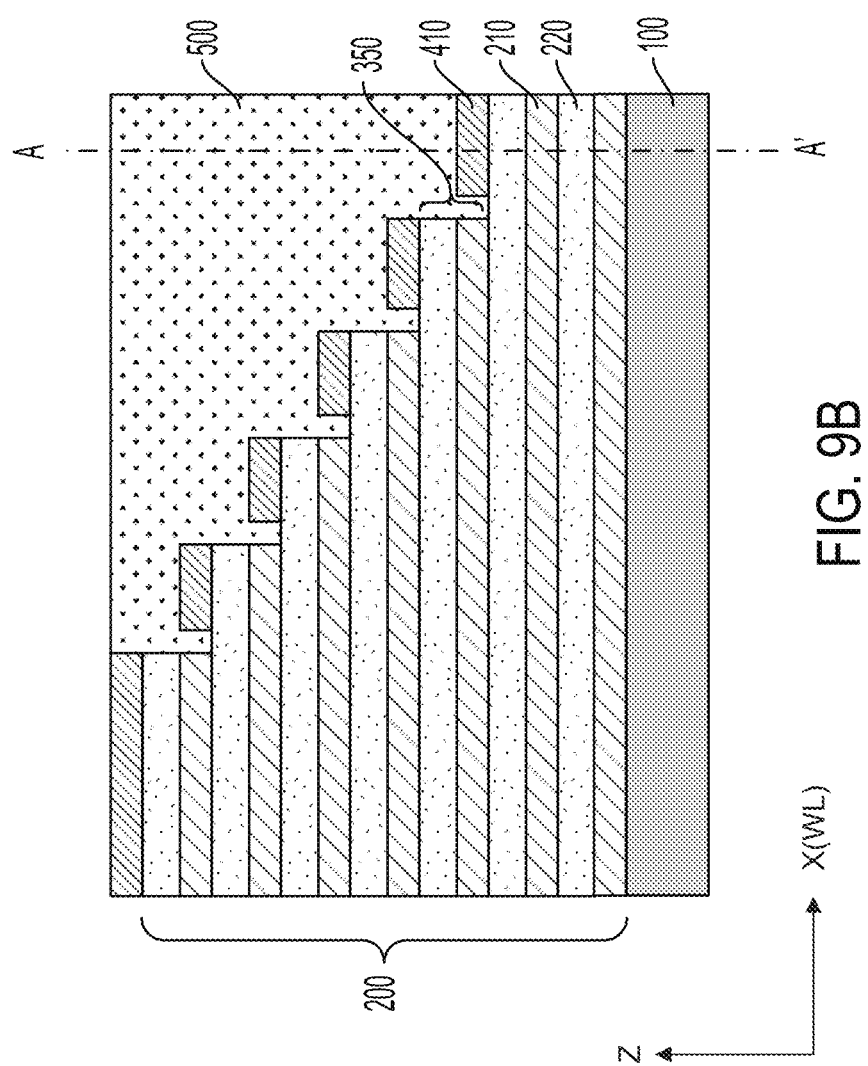
Figure 9C:
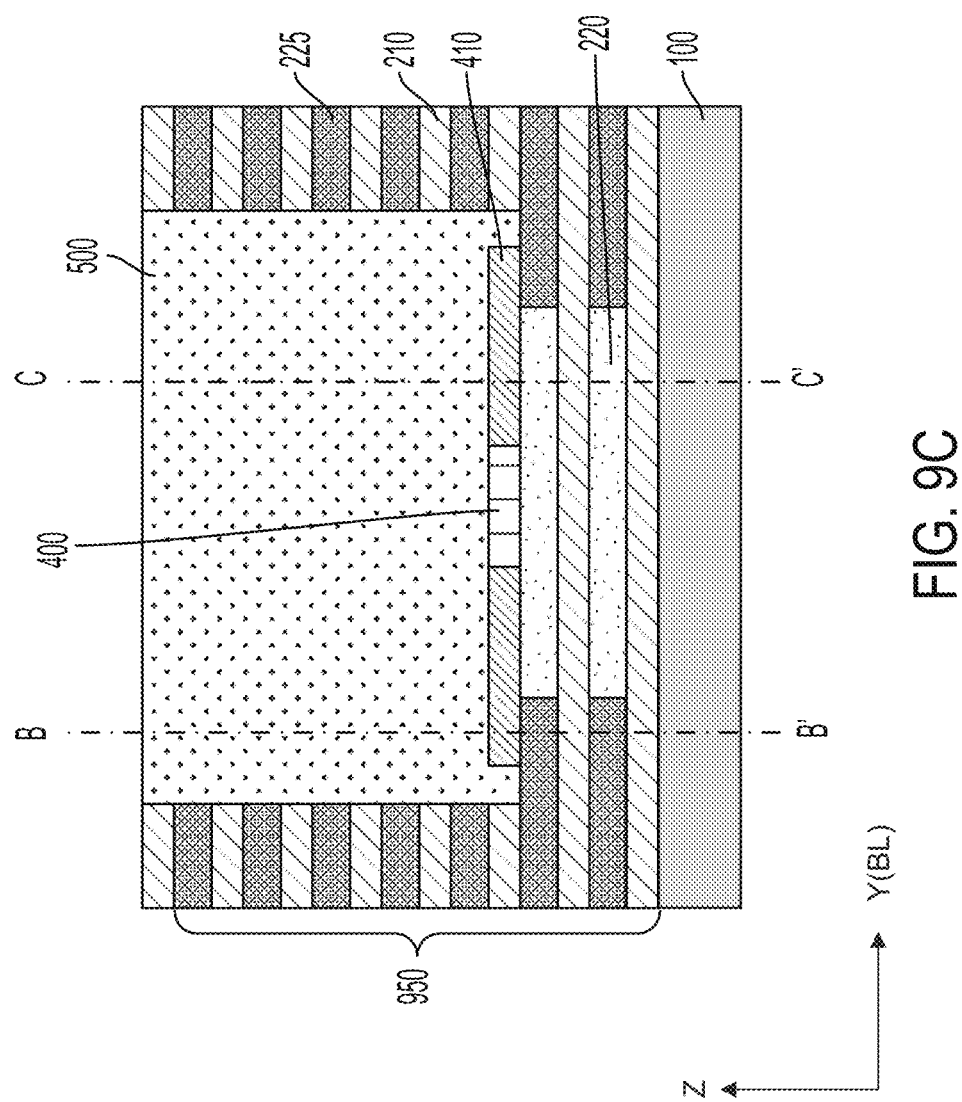

FIGS. 9A-9C illustrate schematic cross-sectional views of an exemplary 3D memory device after step S6, according to some aspects of the present disclosure. FIGS. 9A and 9B illustrate cross-sectional views along the word line direction, and FIG. 9C illustrates a cross-sectional view along the bit line direction perpendicular to the word line direction. Specifically, FIG. 9A illustrates a cross-sectional view along the BB' line shown in FIG. 9C, FIG. 9B illustrates a cross-sectional view along the CC' line shown in FIG. 9C, and FIG. 9C illustrates a cross-sectional view along the CC' line shown in FIGS. 9A and 9B.

As shown in FIGS. 9A and 9C, in some aspects of the present disclosure, the horizontal trenches 220' formed by removing the second insulating layers 220 can be filled with a conductive material (e.g., titanium nitride, tungsten alloy, etc.) to form a plurality of gate layers 225. As such, portions of the dielectric stack structure 200 can be transformed to a dielectric/conductor stack structure 900, and portions of the second type stairs 350 can be transformed to third type stairs 380. As shown in FIG. 9C, the combination of the dielectric/conductor stack structure 900 and the remaining portion of dielectric stack structure 200 can form a stack structure 250. The stack structure 250 can include a staircase region including a plurality of stair structures. Each stair structure can include a second type stair 350 and a third type stair 380 that located on a same level.

The upper spaces 400' formed by removing the portion of the buffer layer 400 on the top surface of each stair can also be filled with a conductive material (e.g., titanium nitride, tungsten alloy, etc.) to form a plurality of contact structures 410 (also referred as "floating contact structures 410"). In some aspects, the contact structures 410 and the gate layers 225 can include the same material. The gate layer of each level and the contact structure 410 of the corresponding level can be electrically connected with each other.

It can be seen from FIG. 9A that the fabricating method does not cause damage to the underlying dielectric/conductor stack structure 900. In addition, it can be seen from FIGS. 9B and 9C that the contact structure 410 can be located on the top surface of each stair and crossing both un-etched second insulating layers 220 and gate layer 225. An first insulating layer 210 is located beneath the contact structure 410. In the subsequent formation of the contact hole which is configured to lead the gate layer of the corresponding stair, the contact structure 410 will not be electrically connected to an adjacent gate layer even if an over-etching occurs, thereby avoiding word line bridging effect between different layers. That is, the disclosed fabricating method can ensure a process window for the subsequent formed contact portion.

As described above, regular IMP process can make a material modification to the SiN layer of each stair. The etching rate of the modified material of the SiN layer can be twice of the etching rate of the regular SiN material. However, the IMP process is difficult to control the consistency of the material modification. It can cause damage to the first insulating layer under the second insulating layer, and even cause damage to the next second insulating layer under the first insulating layer. Such damages can lead to short connections between gate layers thus resulting memory failures. In some aspects, a buffer layer can be used to form a contact structure to realize the electrical connection between the gate layer and the gate contact. The fabricating method of the present disclosure further utilizes the difference of the etching ratio of the buffer layer and the second insulating layer for different etchants to remove the buffer layer and the second insulating layer in two separate etching processes. That is, etching the buffer layer does not cause over etch to the second insulating layer under each stair. Therefore, by forming the contact structure in the spaces of the removed portion of the buffer layer, the second insulating layer in the portions of the dielectric stack structure 200 under the contact structure does not be replaced by gate layer, and thus providing a desired process window of the entire contact structure for the subsequent formed contact portion.

Figure 10A:
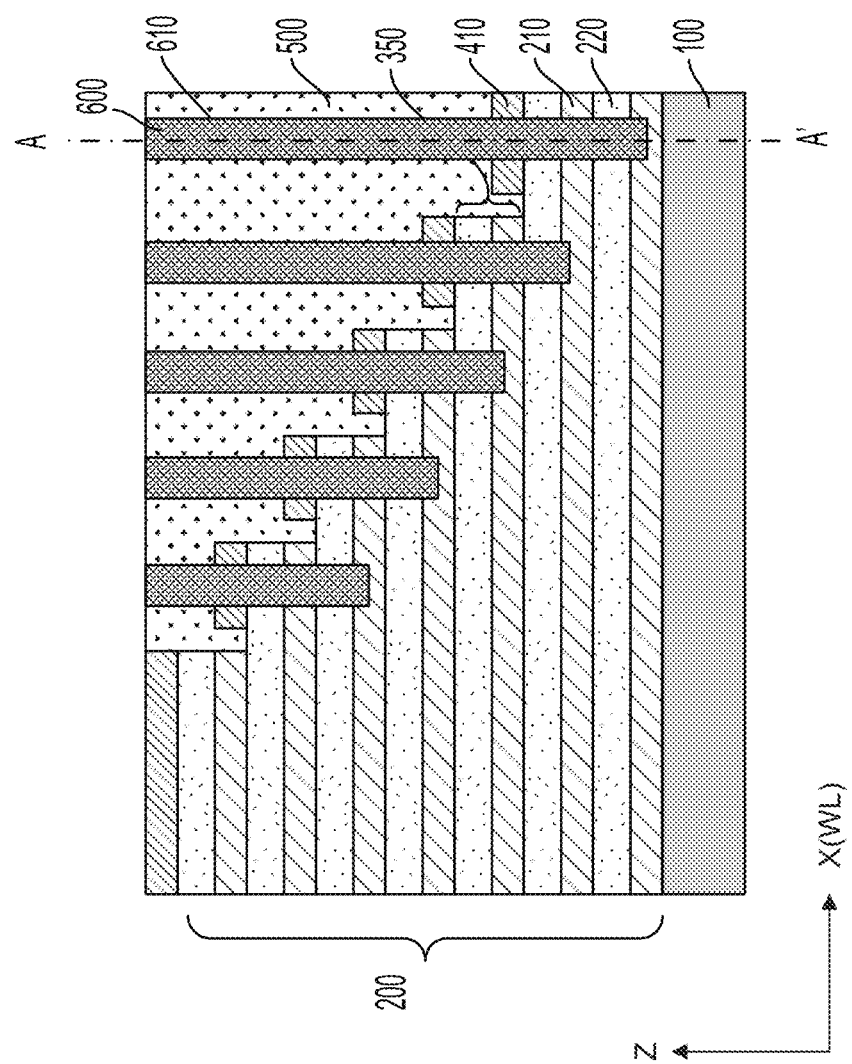
Figure 10B:
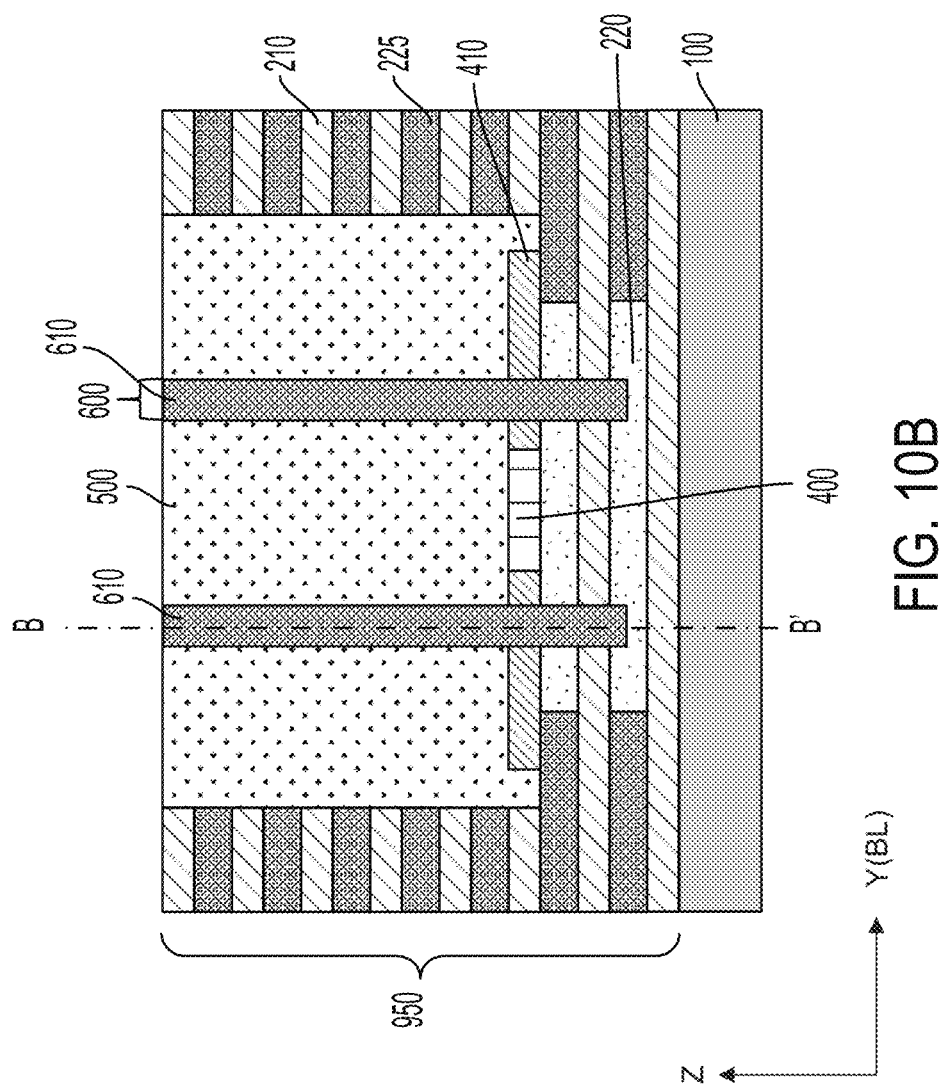

FIGS. 10A and 10B illustrate schematic cross-sectional views of an exemplary 3D memory device after forming a plurality of contact portions, according to some aspects of the present disclosure. Specifically, FIG. 10A illustrates a cross-sectional view along the BB' line (word line direction) shown in FIG. 10B, and FIG. 10B illustrates a cross-sectional view along the AA' line (bit line direction) shown in FIG. 1A.

As shown in FIG. 10A and FIG. 10B, in some aspects of the present disclosure, the method for fabricating a 3D memory device can further include forming a plurality of contact holes 600 each penetrating the dielectric layer 500 and extending to a corresponding contact structure 410 in the staircase region. It is noted that, the locations of the plurality of contact holes 600 can be arranged above the un-etched second insulating layers 220. Even if an over-etching occurs, the contact hole 600 penetrates the underlying first insulating layer 210 and exposes the underlying second insulating layer 220, it still does not expose a lower level gate layer 225.

The plurality of contact holes 600 can be then filled with a conductive material to form a plurality of contact portions 610. In some aspects of the present disclosure, each contact hole 600 can expose the contact structure 410. However, even if an over-etching occurs during etching to form the contact hole 600, the contact portion 610 subsequently formed in the contact hole 600 extends into the contact structure 410 or even penetrates the contact structure 410 and extends into the underlying first insulating layer 210 or even one or more underlying second insulating layers 220, it still does not contact with a lower level gate layer 225, thereby avoiding cross word line short circuits between different gate layers 225.

In some aspects of the present disclosure, the plurality of contact holes 600 can be formed in the staircase region by using photolithography and etching processes. Next, a conductive material, such as titanium nitride, tungsten alloy, etc., can be filled into the plurality of contact holes 600 to form the contact portions 610. It can be seen that each contact portions 610 can be electrically connected to the contact structure 410 of a corresponding layer, and the contact structure 410 can be electrically connected to the gate layer to lead out the gate current.

In some aspects of the present disclosure, the method for fabricating a 3D memory device can further include forming one or more dummy channel holes that penetrate the staircase region and extend into the semiconductor layer in the staircase region, and filling the one or more dummy channel holes with an insulating material to form one or more dummy channel structures. In one example, one or more dummy channel holes (not shown) that penetrate the dielectric layer 500 and extend into the semiconductor layer 100 can be formed in the staircase region by using photolithography and etching processes. Next, the one or more dummy channel holes are filled with an insulating material to form one or more dummy channel structures. For example, the one or more dummy channel structures can be formed by depositing a silicon nitride based material using ALD. In some aspects of the present disclosure, the one or more dummy channel holes and the plurality of contact holes 600 can be formed in a same etching process, and then be filled with the insulating material and the conductive material respectively.

It should be noted that, the above described materials of the various layers of the 3D memory device, and the specific processes of the formation and removal of the various layers of the 3D memory device, are merely examples which should not limit the scope of the present disclosure.

Another aspect of the present disclosure provides a three-dimensional (3D) memory device. The 3D memory device can be formed by the fabricating method 1000 described above.

In some aspects of the present disclosure, as shown in FIGS. 10A-10B, the 3D memory device include: a semiconductor layer 100; a stack structure 950 disposed on the semiconductor layer 100, including a plurality of stair structures, and including a plurality of alternately stacked gate layers and first insulating layers; a plurality of contact structures 410, each being located on a top surface of a corresponding stair 300, and being formed by replacing a buffer layer on the top surface of the corresponding stair 300 with a conductive material; a dielectric layer 500 located above the stairs 300 and the contact structures 410. The contact structures 410 located on the top surfaces of the adjacent stairs 300 is separated by the dielectric layer 500. In some aspects of the present disclosure, the contact structures 410 can be formed by the fabricating method described above.

In some aspects of the present disclosure, a chemical mechanical polishing (CMP) process can be performed to planarize the dielectric layer 500, such that the dielectric layer 500 can provide a flat top surface for the staircase region of the stack structure 950.

In some aspects of the present disclosure, as shown in FIG. 9A and FIG. 9B, the heights of the contact structures can be approximately the same. However, the contact structures 410 in the figures are only exemplary. In some other aspects of the present disclosure, the heights of the contact structures on the top surfaces of stairs can be different or partially different from each other. For example, in the actual process of forming contact holes, the stairs away from the semiconductor layer can be more likely to be over-etched. Therefore, in order to better ensure the process window of the contact portions on the stairs, the heights of the contact structures away from the semiconductor layer can be higher than the heights of the contact structures close to the semiconductor layer.

In some aspects of the present disclosure, as shown in FIGS. 9A and 9B, the top surface of each contact structure can be coplanar with the bottom surface of the gate layer in the upper level. However, the contact structures 410 in the figures are only exemplary. In some other aspects of the present disclosure, the top surface of the contact structure can be slightly lower or higher than the bottom surface of the gate layer in the upper level.

In some aspects of the present disclosure, as shown in FIG. 9A and FIG. 9B, the shape of the side surface of each contact structure 410 can be a rectangle. However, the contact structures 410 in the figures are only exemplary. In some other aspects of the present disclosure, at least one side surface of each contact structure can have a curved shape.

In some aspects of the present disclosure, as shown in FIGS. 9A and 9B, the contact surface between the contact structure and the gate layer can be a flat surface. However, the contact structures 410 in the figures are only exemplary.

In some other aspects of the present disclosure, the contact surface between the contact structure and the gate layer can be a concave surface or a convex surface.

In some aspects of the present disclosure, as shown in FIGS. 10A and 10B, the 3D memory device can further include multiple contact portions 610 each penetrating the dielectric layer 500 and extending to a corresponding contact structure 410 to form an electrical connection with the corresponding contact structure 410.

In some aspects of the present disclosure, the 3D memory device can further include a plurality of dummy channel structures each penetrating the dielectric layer and the stack structure and extending to the semiconductor layer. In one example, the dummy channel structure can include an insulating filling layer.

Accordingly, three-dimensional memory devices and fabricating methods thereof are provided.

The disclosed method of forming a three-dimensional memory device can comprises: forming a dielectric stack structure comprising a plurality of first insulating layers and a plurality of second insulating layers on a semiconductor layer, wherein the dielectric stack structure comprises a staircase region; forming a buffer layer to cover the staircase region; removing portions of the plurality of second insulating layers to form a plurality of horizontal trenches; removing a portion of the buffer layer above at least one horizontal tranche to form at least one upper space on the horizontal trench; forming a plurality of gate layers in the plurality of horizontal trenches; and forming at least one contact structure in the at least one upper space.

In some aspects, forming the stack structure comprises: alternately forming the plurality of first insulating layers and the plurality of second insulating layers on the semiconductor layer; removing portions of the plurality of second insulating layers and the first insulating layers to form the plurality of first type stairs, wherein each first type stair exposes a portion of the corresponding first insulating layer; and removing the exposed portion of the corresponding first insulating layer in each first type stair to form a plurality of second type stairs.

In some aspects, the method further comprises: before forming the plurality of horizontal trenches, forming a dielectric layer on the plurality of second type stairs and the buffer layer; and after forming the at least one contact structure, forming at least one contact portion in the dielectric layer and in contact with the at least one contact structure.

In some aspects, the method further comprises: before forming the dielectric layer, removing portions of the buffer layer on the sidewall of each second type stair; wherein the dielectric layer is formed to cover the sidewall of each second type stair.

In some aspects, each of the at least one upper space comprises: a first portion of the at least one upper space above and interconnected with a corresponding horizontal trench; and a second portion of the at least one upper space above and exposing an un-removed portion of a corresponding second insulating layer.

In some aspects, each of the at least one contact structure comprises: a first portion of the at least one contact structure above and in contact with one corresponding gate layer; and a second portion of the at least one contact structure above the un-removed portion of one corresponding second insulating layer and in contact with an un-removed portion of the buffer layer.

In some aspects, the at least one contact portion is in contact with the second portion of the at least one contact structure.

In some aspects, in a first etchant, a first etching rate of the buffer layer is greater than a second etching rate of the second insulating layer.

In some aspects, in the first etchant, the first etching rate of the buffer layer is at least 10 times of the second etching rate of the second insulating layer.

In some aspects, the buffer layer comprises polycrystalline silicon; and the second insulating layer comprises a nitride material.

In some aspects, removing the portions of the plurality of second insulating layers comprises: using phosphoric acid as a second etchant, and performing a wet etching process to remove the portions of the plurality of second insulating layers.

In some aspects, removing the portion of the buffer layer comprises: using tetramethylammonium hydroxide as the first etchant, and performing a wet etching process to remove the portion of the buffer layer.

In some aspects, the plurality of gate layers and the at least one contact structure are formed in a same process of filling the plurality of horizontal trenches and the at least one upper space with a conductive material.

Another aspect of the present disclosure provides a three-dimensional memory device, comprising: a semiconductor layer; a stack structure comprising a plurality of gate layers, a plurality of first insulating layers, and a plurality of second insulating layers, wherein the stack structure has a staircase region comprising a plurality of stair structures, wherein each stair structure comprises: a first portion of the stair structure comprising one of the plurality of gate layers and a first portion of one of the plurality of first insulating layers, and a second portion of the stair structure comprising a second portion of the one of the plurality of first insulating layers and one of the plurality of second insulating layers; at least one contact structure each located on a top surface of one of the plurality of stair structures; and at least one contact portion in contact with the at least one contact structure.

In some aspects, the device further comprises: a dielectric layer located above the plurality of stair structures and the at least one contact structure; wherein the at least one contact portion is located in the dielectric layer.

In some aspects, a top surface of the at least one contact structure is coplanar with or lower than a bottom surface of a gate layer in an upper stair structure of the one of the plurality of stair structures.

In some aspects, the at least one contact structure comprises: a first portion of the at least one contact structure located on the first portion of the corresponding stair structure, and in contact with a top surface of the gate layer of the corresponding stair structure; and a second portion of the at least one contact structure located on the second portion of the corresponding stair structure, and in contact with a top surface of the second insulating layer of the corresponding stair structure.

In some aspects, the at least one contact portion is in contact with the second portion of the at least one contact structure.

In some aspects, the second portion of the at least one contact structure is further in contact with a buffer layer located in a same level of the at least one contact structure.

Other aspects of the present disclosure can be understood by those skilled in the art in light of the description, the claims, and the drawings of the present disclosure.

The foregoing description of the specific aspects will so fully reveal the general nature of the present disclosure that others can, by applying knowledge within the skill of the art, readily modify and/or adapt for various applications such specific aspects, without undue experimentation, without departing from the general concept of the present disclosure. Therefore, such adaptations and modifications are intended to be within the meaning and range of equivalents of the disclosed aspects, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Aspects of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary aspects of the present disclosure as contemplated by the inventor(s), and thus, are not intended to limit the present disclosure and the appended claims in any way.

The breadth and scope of the present disclosure should not be limited by any of the above-described exemplary aspects, but should be defined only in accordance with the following claims and their equivalents.

What is claimed is:

1. A method of forming a three-dimensional memory device, comprising:
    forming a dielectric stack structure comprising a plurality of first insulating layers and a plurality of second insulating layers on a semiconductor layer, wherein the dielectric stack structure comprises a staircase region;
    forming a buffer layer to cover the staircase region;
    removing first portions of the plurality of second insulating layers to form a plurality of horizontal trenches;
    removing a portion of the buffer layer above at least one horizontal trench to form at least one upper space on the horizontal trench, wherein the at least one upper space comprises:
        a first portion above and interconnected with a corresponding horizontal trench; and
        a second portion above and exposing an un-removed portion of a corresponding second insulating layer;
    forming a plurality of gate layers in the plurality of horizontal trenches; and
    forming at least one contact structure in the at least one upper space.

2. The method of claim 1, wherein the plurality of gate layers and the at least one contact structure are formed in a same process of filling the plurality of horizontal trenches and the at least one upper space with a conductive material.

3. The method of claim 1, wherein forming the dielectric stack structure comprises:
    alternately forming the plurality of first insulating layers and the plurality of second insulating layers on the semiconductor layer;
    removing second portions of the plurality of second insulating layers and portions of the plurality of first insulating layers to form a plurality of first type stairs, wherein each first type stair exposes a portion of a corresponding first insulating layer; and removing the exposed portion of the corresponding first insulating layer in each of the first type stair to form a plurality of second type stairs.

4. The method of claim 3, further comprising:
before forming the plurality of horizontal trenches, forming a dielectric layer on the plurality of second type stairs and the buffer layer; and
after forming the at least one contact structure, forming at least one contact portion in the dielectric layer and in contact with the at least one contact structure.

5. The method of claim 4, further comprising, before forming the dielectric layer, removing portions of the buffer layer on a sidewall of each second type stair, wherein the dielectric layer is formed to cover the sidewall of each of the second type stair.

6. The method of claim 1, wherein each of the at least one contact structure comprises:
a first portion of the at least one contact structure above and in contact with one corresponding gate layer; and
a second portion of the at least one contact structure above the un-removed portion of one corresponding second insulating layer and in contact with an un- removed portion of the buffer layer.

7. The method of claim 6, wherein at least one contact portion is in contact with the second portion of the at least one contact structure.

8. The method of claim 7, wherein removing the portion of the buffer layer comprises using tetramethylammonium hydroxide as a first etchant, and performing a wet etching process to remove the portion of the buffer layer.

9. The method of claim 1, wherein, in a first etchant, a first etching rate of the buffer layer is greater than a second etching rate of a second insulating layer of the plurality of second insulating layers.

10. The method of claim 9, wherein, in the first etchant, the first etching rate of the buffer layer is at least 10 times of the second etching rate of the second insulating layer.

11. The method of claim 9, wherein:
the buffer layer comprises polycrystalline silicon; and
the second insulating layer comprises a nitride material.

12. The method of claim 9, wherein removing the first portions of the plurality of second insulating layers comprises using phosphoric acid as a second etchant, and performing a wet etching process to remove the first portions of the plurality of second insulating layers.

\* \* \* \* \*